United States Patent [19]

Nixon et al.

[11] Patent Number: 4,624,739
[45] Date of Patent: Nov. 25, 1986

[54] PROCESS USING DRY ETCHANT TO AVOID MASK-AND-ETCH CYCLE

[75] Inventors: Paul E. Nixon; Murty S. Polavarapu; David Stanasolovich, all of Manassas, Va.

[73] Assignee: International Business Machines Corporation, Armonk, N.Y.

[21] Appl. No.: 764,148

[22] Filed: Aug. 9, 1985

[51] Int. Cl.$^4$ ............... B44C 1/22; C03C 15/00; C03C 25/06
[52] U.S. Cl. .................... 156/643; 156/644; 156/646; 156/653; 156/657; 156/659.1; 204/192.32; 252/79.1
[58] Field of Search ............... 156/643, 644, 646, 653, 156/657, 659.1, 661.1, 662; 252/79.1; 204/192 EC, 192 E; 427/38, 39

[56] References Cited

U.S. PATENT DOCUMENTS

| 4,180,432 | 12/1979 | Clark | 156/643 |
| 4,253,907 | 3/1981 | Parry et al. | 156/643 |
| 4,457,820 | 7/1984 | Bergeron et al. | 204/192 E |
| 4,473,436 | 9/1984 | Beinvogl | 156/643 |
| 4,479,850 | 10/1984 | Beinvogl et al. | 156/643 |
| 4,508,815 | 4/1985 | Ackmann et al. | 156/653 X |
| 4,532,002 | 7/1985 | White | 156/653 X |

OTHER PUBLICATIONS

Chang et al, Hydrogen Plasma Etching of Semiconductors and their Oxides, J. Vac. Sci. Technol., 3/82, pp. 490–491; 1/82, pp. 45–52.

Primary Examiner—William A. Powell
Attorney, Agent, or Firm—Manny W. Schecter; John E. Hoel; Maurice H. Klitzman

[57] ABSTRACT

A process is disclosed for simultaneously etching holes in both the thick and thin portions of a dielectric layer on a semiconductor substrate. An anisotropic dry etchant is used to eliminate any significant lateral etching of the dielectric layer during etching. Thus, a mask-and-etch cycle may be eliminated from processing during integrated circuit manufacture, yet dimensional tolerances are maintained.

10 Claims, 5 Drawing Figures

PROCESS USING DRY ETCHANT TO AVOID MASK-AND-ETCH CYCLE

BACKGROUND OF THE INVENTION

1. Field of the Invention

This invention relates to a process for simultaneously etching holes in both thick and thin portions of a dielectric layer on a semiconductor substrate. More particularly, the process is used to eliminate a mask-and-etch cycle in the manufacturing of integrated circuits.

2. Description of the Related Art

The etching of dielectric layers on a semiconductor substrate is critical to the manufacture of integrated circuits. Repeated masking and etching cycles of the dielectric layers are used to define the minute structural patterns of the integrated circuit devices. Wet etching processes are the conventional etching processes used. These processes etch isotropically. Therefore, significant lateral, as well as vertical, etching occurs during processing. The conventional wet etching of a dielectric layer 12 on a semiconductor substrate 11 is illustrated in FIGS. 1 and 2. The area of dielectric layer 12 to be etched is defined by a window 14 in a conventional photolithographic mask 13. Upon exposure of dielectric layer 12 to wet etching, an area 16 of semiconductor substrate 11 is exposed. Vertical etching is represented by arrow 17 and lateral etching by arrow 18 of FIG. 2. Thus, the size of area 16 is a function of the size of window 14, the amount of vertical etching, and the amount of lateral etching that occurs in dielectric layer 12. Wet etching is required for a long enough time to ensure complete vertical etching 17 of dielectric layer 12, yet the etching time must be minimized to avoid excessive lateral etching 18. Excessive lateral etching results in the increased size of area 16, thereby making maintenance of the dimensional tolerances required more difficult.

In reducing the costs of manufacture, it is desirable to maximize the number of holes etched in a dielectric layer in a single mask-and-etch cycle. However, etched holes are often required in portions of a dielectric layer having significantly different thicknesses. The simultaneous wet etching of holes through both thick and thin portions of a dielectric layer can be disastrous. Once the thin portion of the dielectric layer is etched through vertically, no further vertical etching occurs in that portion. However, wet etching must proceed for a significant time to allow for the completion of vertical etching through the thick portion of the dielectric layer. During this extra etching time, the thin portion of the dielectric layer will continue to be etched laterally, thereby increasing the size of the exposed portion of the underlying substrate. If the window in the mask overlying the dielectric layer cannot be made smaller, the excessive lateral etching may make it impossible to meet the required dimensional tolerances. The mask window may already be of the smallest size possible within the limits of existing technology, making the simultaneous etching of both the thick and thin portions of the dielectric layer impractical.

It is therefore desirable to create an etching process capable of eliminating a mask-and-etch cycle in integrated circuit manufacture by simultaneously etching both the thick and thin portions of a dielectric layer on a semiconductor substrate with a minimum of lateral etching.

SUMMARY OF THE INVENTION

It is the principal object of this invention to provide an improved process for simultaneously etching both the thick and thin portions of a dielectric layer on a semiconductor substrate while minimizing lateral etching.

This and other objects are accomplished by employing an anisotropic dry etchant. The dielectric layer is masked allowing for windows over both the thick and thin portions of the layer. The dielectric layer is then exposed to the anisotropic dry etchant through the mask windows until the dielectric layer in each window is etched down to the semiconductor substrate. Because no significant lateral etching occurs, dimensional tolerances are easily maintained.

DESCRIPTION OF THE PREFERRED EMBODIMENT

Figure 1:
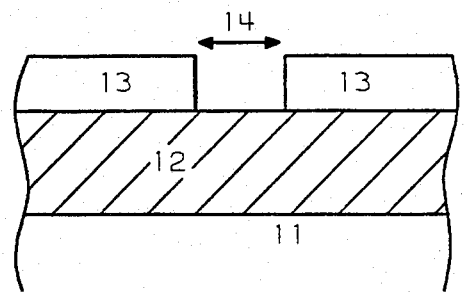
FIG. 1 is a partial cross-sectional view of a semiconductor substrate having a dielectric layer with mask thereon.
Figure 2:
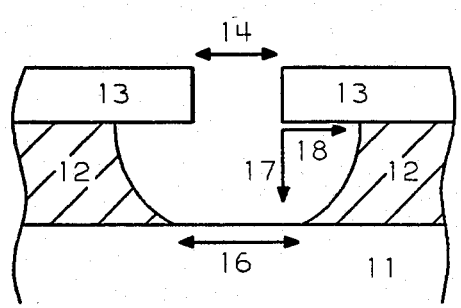
FIG. 2 is a partial cross-sectional view of the structure of FIG. 1 after wet etching.
Figure 3:
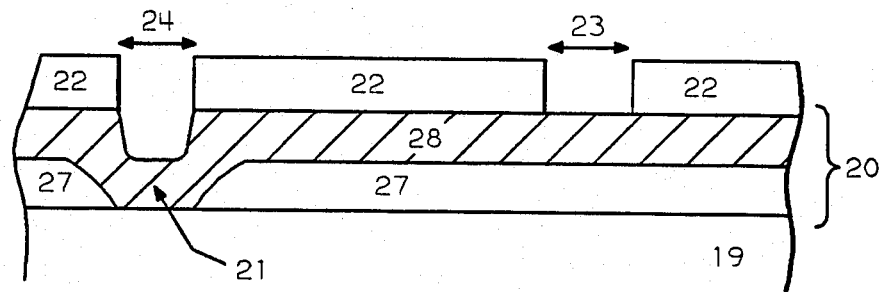
FIG. 3 is a partial cross-sectional view of a semiconductor substrate having both thick and thin portions of a dielectric layer with mask thereon.

FIG. 3 shows a silicon substrate 19 with both thick and thin portions 20, 21 of a dielectric layer thereon. Thin portion 21 is phosphosilicate glass 28. Thick portion 20 includes composite layers of silicon dioxide 27 and phosphosilicate glass (hereinafter referred to as PSG) 28. Window 23 in mask 22 exposes the surface of the thick portion 20 of the dielectric layer. Window 24 in mask 22 exposes the surface of the thin portion 21 of the dielectric layer. Masking may be accomplished by any conventional technique, such as photolithography.

Figure 4:
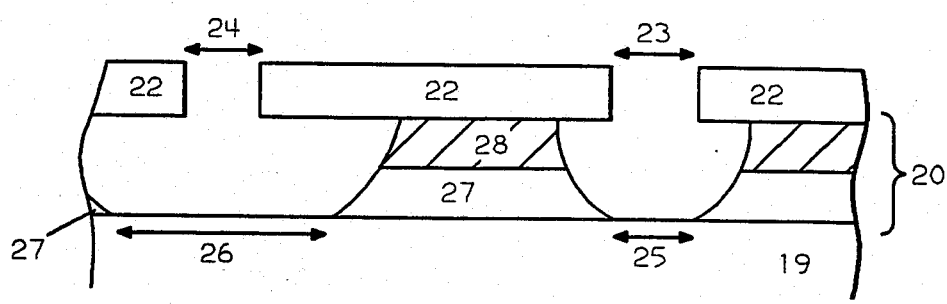
FIG. 4 is a partial cross-sectional view of the structure of FIG. 3 after wet etching.

Referring to FIG. 4, silicon substrate 19 and portions 20 and 21 of the dielectric layer are shown after exposure to a wet etchant such as dilute hydrofluoric acid. The wet etchant consumed thick and thin portions 20, 21 of the dielectric layer through windows 23 and 24 until areas 25 and 26 of the silicon substrate were exposed. The excess time required to complete vertical etching of thick portion 20 of the dielectric layer resulted in significant lateral etching of thin portion 21 of the dielectric layer. The lateral etching resulted in an expanded area 26 with potentially disastrous results if dimensional tolerances are not maintained.

Figure 5:
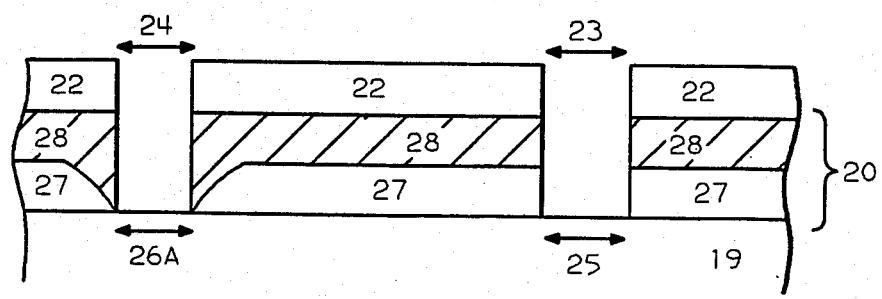
FIG. 5 is a partial cross-sectional view of the structure of FIG. 3 after anisotropic dry etching.

FIG. 5 shows the same structure as shown in FIG. 4 except that the wet etchant used was replaced by an anisotropic dry etchant. An example of such a dry etchant is a mixture of gaseous hydrogen and carbon tetrafluoride containing 29% to 35% hydrogen by volume. The etchant can be used in the reactive ion etch mode under the conditions of 29 millitorr of pressure and 0.58 watts/cm-cm power density. Any conventional parallel plate dry etching apparatus can be used. Similar to the wet etch process, the dry etchant consumed the dielectric layer through windows 23 and 24 until areas 25 and 26a of the silicon substrate were exposed. Because the dry etchant is anisotropic, no significant lateral etching occurred. Thus, much tighter dimensional control is maintained over area 26a during anisotropic dry etching in comparison with area 26 during wet etching. Simultaneous etching of both the thick and thin portions of a dielectric layer on a silicon substrate is thereby accomplished. A mask-and-etch cycle otherwise required is eliminated. The mask may next be removed and further processing continued.

The material requirements of the process invention are relative. Although a mixture of hydrogen and carbontetrafluoride has been identified, other dry etching compositions may be used. The substrate may be composed of silicon or other materials, such as germanium or gallium arsenide. The layer to be etched may be comprised of composite layers of silicon dioxide and PSG as mentioned, or either silicon dioxide or PSG alone, or yet other individual or composite layer materials. The mask may be a conventional photoresist, or other applicable materials. The significant requirement is that the dry etchant selectively etch the layer relative to the substrate and mask at a ratio of at least 20 to 1. Furthermore, the dry etchant must consume the layer anisotropically. Anisotropic etching, as herein defined, refers to a rate of vertical etching at least 15 times greater than the rate of lateral etching.

While the invention has been particularly described with reference to a preferred embodiment thereof, it will be understood by those skilled in the art that various changes in detail may be made therein without departing from the spirit, scope, and teaching of the invention. Accordingly, the process herein disclosed is to be limited only as specified in the following claims.

What is claimed is:

1. A process for simultaneously etching holes through both thick and thin portions of a layer on a substrate, comprising the steps of:
    masking the surface of said layer with a mask having a first window over said thin portion of said layer and a second window over said thick portion of said layer;
    exposing the upper surface of said layer through said first window and through said second window to an anisotropic dry etchant until said exposed layer in said first and said second windows is etched down to the substrate, said anisotropic dry etchant selectively etching said layer relative to said substrate and said mask.

2. A process as described in claim 1, wherein said layer is a dielectric layer.

3. A process as described in claim 2, wherein said dielectric layer is a member of the group consisting of silicon dioxide, phosphosilicate glass, and a composite layer of silicon dioxide and phosphosilicate glass.

4. A process as described in claim 1, wherein said anisotropic dry etchant selectively etches said layer relative to said substrate and said mask at a ratio of at least 20 to 1.

5. A process as described in claim 2, wherein said anisotropic dry etchant selectively etches said layer relative to said substrate and said mask at a ratio of at least 20 to 1.

6. A process as described in claim 3, wherein said anisotropic dry etchant selectively etches said layer relative to said substrate and said mask at a ratio of at least 20 to 1.

7. A process as described in claim 1, wherein said anisotropic dry etchant is a gaseous mixture of hydrogen and carbontetrafluoride.

8. A process as described in claim 2, wherein said anisotropic dry etchant is a gaseous mixture of hydrogen and carbontetrafluoride.

9. A process as described in claim 3, wherein said anisotropic dry etchant is a gaseous mixture of hydrogen and carbontetrafluoride.

10. A process for simultaneously etching holes through both thick and thin portions of a dielectric layer on a semiconductor substrate, comprising the steps of:
    masking the surface of said dielectric layer with a mask having a first window over said thin portion of said dielectric layer and a second window over said thick portion of said dielectric layer;
    exposing the upper surface of said dielectric layer through said first window and through said second window to a gaseous mixture of hydrogen and carbon tetrafluoride until said exposed dielectric layer in said first and said second windows is etched down to the semiconductor substrate, said gaseous mixture selectively etching said dielectric layer relative to said semiconductor substrate and said mask at a ratio of at least 20 to 1.

* * * * *